(12) United States Patent
Moore et al.

(10) Patent No.: US 6,200,691 B1
(45) Date of Patent: Mar. 13, 2001

(54) OXIDATION RESISTANCE COATING SYSTEM FOR REFRACTORY METALS

(75) Inventors: John J. Moore, Golden, CO (US); Shrinivas Govindarajan, Richmond, VA (US)

(73) Assignee: Colorado School of Mines, Golden, CO (US)

( * ) Notice: Subject to any disclaimer, the term of this patent is extended or adjusted under 35 U.S.C. 154(b) by 0 days.

(21) Appl. No.: 09/062,857

(22) Filed: Apr. 20, 1998

(51) Int. Cl.⁷ .............................. B32B 15/00; B32B 15/04
(52) U.S. Cl. .................. 428/615; 428/627; 428/641; 428/655; 428/663; 428/664
(58) Field of Search .................. 428/610, 615, 428/627, 641, 655, 660, 661, 663, 664, 937, 457, 469; 65/374.12, 374.13; 416/241 R, 241 B

(56) References Cited

U.S. PATENT DOCUMENTS

| | | | |
|---|---|---|---|
| 5,300,322 | * | 4/1994 | Lowden ............................. 427/255 |
| 5,304,342 | * | 4/1994 | Hall et al. ............................ 419/11 |
| 5,472,487 | * | 12/1995 | Chin et al. ..................... 106/287.11 |
| 5,874,175 | * | 2/1999 | Li ....................................... 428/457 |

OTHER PUBLICATIONS

S. Govindarajan, J.J. Moore, T.R. Ohno and J. Disam, "Development of a Si/C Diffusion Barrier Layer Based on the Mo–Si–C–N System," Cover Sheet for ICMCTF97 Conference, Paper No. A1.03. (No Month/Date).

S. Govindarajan, J.J. Moore, D.J. Aldrich, T.R. Ohno and J. Disam, "Characterization of RF Sputtered $MoSi_xC_yN_z$ Coatings on Mo Substrates", vol. 1, Metallic High Temperature Materials, pp. 720–733, May 1997.

S. Govindarajan, J.J. Moore, T.A. Ohno and J. Disam, "Interfacial Characterization of $MOSI_2$+ X Sic Composite Thin Films on Molybdenum Substrates," presented at the MRS Fall Meeting, Boston, Dec. 2–6, 1996.

* cited by examiner

Primary Examiner—Timothy M. Speer
Assistant Examiner—Bryant Young
(74) Attorney, Agent, or Firm—Holme, Roberts & Owen, LLP

(57) ABSTRACT

A coating system (10) formed on a molybdenum substrate (12) includes an oxidation resistance layer (14), a CTE matching layer (16) disposed between the oxidation resistance layer (14) and the substrate (12), and a novel barrier layer (18) disposed between the CTE matching layer (16) and the substrate (12). The CTE matching layer reduces stresses due to differential expansion/contraction as between the substrate (12) and the oxidation resistance layer (14), especially for high temperature applications. The barrier layer (18), which remains amorphous at temperatures up to at least 1000° C., inhibits diffusion of carbon and silicon into substrate (12).

42 Claims, 5 Drawing Sheets

OXIDATION RESISTANCE COATING SYSTEM FOR REFRACTORY METALS

FIELD OF THE INVENTION

The present invention relates in general to coatings for refractory metals and, in particular, to a coating system incorporating novel coefficient of thermal expansion (CTE) matching and diffusion barrier layers.

BACKGROUND OF THE INVENTION

The use of refractory metals, such as molybdenum and tantalum, has been investigated for a number of applications due to the high temperature mechanical properties and high melting points of such metals. The principal disadvantage of the use of refractory metals in high temperature applications is the poor resistance of refractory metals to oxidation. Molybdenum, in particular, is subject to severe oxidation in high temperature environments.

In order to reduce oxidation, researchers have investigated the use of a variety of coating systems on refractory metal substrates. In particular, certain silicides of refractory metals, such as molybdenum disilicide, have been identified as promising coating system components for oxidation resistance. Unfortunately, in such coating systems, silicon tends to diffuse from the oxidation resistance coating into the substrate resulting in formation of less oxidation resistant sub-silicides and impaired mechanical properties, e.g., loss of ductility. Some research has addressed the possibility of synthesizing a nitrided composite film as a potential diffusion barrier layer, based on encouraging diffusion barrier characteristics reported for a nitrided molybdenum disilicide film. However, research is continuing and it is apparent that substantial challenges remain with respect to fully realizing the potential benefits of refractory metals for a variety of high temperature applications.

SUMMARY OF THE INVENTION

The present invention relates to a refractory metal coating system including a novel diffusion barrier layer that can be used in conjunction with a CTE matching layer. It has been recognized that a significant problem associated with oxidation resistance coating systems for high temperature, refractory metal applications is the potential CTE mismatch between the substrate and the oxidation resistance coating layer. This CTE mismatch can result in interface stresses and possible faults as a result of differential expansion/contraction due to temperature variations associated with high temperature applications. The present invention addresses this potential CTE mismatch as well as potential coating material diffusion concerns to provide an improved refractory metal coating system.

According to one aspect of the present invention, a CTE matching layer is provided to address CTE mismatch concerns. In particular, the resulting coated product includes a substrate of refractory metal such as molybdenum, an oxidation resistance layer that may be formed from, for example, molybdenum disilicide, and a CTE matching layer disposed between the substrate and the oxidation resistance layer having a first CTE at a first portion thereof adjacent to the substrate and a second CTE at a second portion thereof adjacent to the oxidation resistance layer. Preferably, the first CTE substantially matches the CTE of the substrate or any intervening coating layer such as a diffusion barrier layer. The second CTE preferably matches that of the oxidation resistance layer.

According to another aspect of the present invention, a novel barrier layer is provided as part of a coating system for a refractory metal. The coating system includes an oxidation resistance coating and, preferably, a CTE matching layer in addition to the diffusion barrier layer. The barrier layer, which is disposed between the oxidation resistance coating and the refractory metal substrate, inhibits diffusion of material from the oxidation resistance coating and/or CTE matching layer into the substrate. A preferred barrier layer is a composite material including a carbon containing component such as SiC. The barrier layer may, for example, be a material in the Mo—Si—C—N quarternary system.

In one embodiment, an oxidation resistance coating system is provided for a molybdenum substrate. The coating system includes an oxidation resistance layer formed on the molybdenum substrate, a CTE matching layer disposed between the oxidation resistance layer and the molybdenum substrate, and a barrier layer disposed between the CTE matching layer and the molybdenum substrate. The oxidation resistance layer is preferably formed from a silicide of molybdenum such as $MoSi_2$. A self-healing silica scale forms on this layer during oxidation and provides a diffusion barrier for oxygen. The oxidation resistance layer may be doped, e.g., with boron and/or germanium to lower the viscosity of the resulting glassy oxide. The CTE matching layer has a graded composition and CTE across its depth such that the CTE at an upper portion of the CTE matching is substantially the same as that of the oxidation resistance layer and the CTE at a lower portion of the CTE matching layer is substantially the same as the substrate or is adjusted slightly from the CTE of the substrate in view of the intervening barrier layer. In this regard, a preferred CTE matching layer is a composite coating formed from $MoSi_2+X$ SiC where X varies as a function of depth from substantially zero at the $MoSi_2$ interface to a value selected so that the CTE of the composite coating substantially matches that of the molybdenum substrate and/or the barrier layer at the barrier layer interface. A composite of $MoSi_2$ with 1.96 moles of SiC (i.e., approximately 50 percent by weight) has a similar CTE to Mo, but this value of X may be varied somewhat due to the presence of the diffusion barrier layer. The diffusion barrier layer, in this embodiment of the invention, inhibits diffusion of carbon and silicon into the substrate, and is preferably a coating in the Mo—Si—C—N quaternary system, i.e., $MoSi_xC_yN_z$. A suitable barrier layer can be conveniently formed by sputtering the $MoSi_2+X$ SiC composite coating material in a nitrogen ambient, where the nitrogen pressure during deposition is selected, in conjunction with the other deposition process parameters, to yield appropriate diffision barrier layer characteristics.

This coating system can be fabricated according to the present invention by: 1) forming a composite Mo $Si_2+X$ SiC sputtering target by reaction synthesis using powders of Mo, Si and β-SiC and hot pressing, 2) RF sputtering the composite target in a nitrogen ambient to form the barrier layer, 3) continuing to RF sputter the composite target in a vacuum or inert ambient to form the CTE matching layer, 4) applying a layer of doped $MoSi_2$, e.g., by plasma spraying, and 5) annealing the composite films (before or after application of the oxidation resistant coating), e.g., at 1000° C. for 30 minutes in a vacuum furnace. Analysis has shown that the films from the composite target are amorphous as deposited. Upon annealing, the CTE layer crystallizes but the barrier layer remains amorphous and is effective in minimizing diffusion of silicon and carbon into the molybdenum substrate.

The present invention thus provides a refractory metal coating system that reduces oxidation and therefore yields a coated product suitable for various high temperature refractory metal applications in the glass manufacturing, nuclear energy, aircraft and space technology industries. The coating system also reduces potential damaging stresses due to CTE mismatch between the substrate and the oxidation resistance coating material, and reduces diffusion of coating materials into the substrate which could otherwise compromise the mechanical properties of the coated refractory metal product.

BRIEF DESCRIPTION OF THE DRAWINGS

For a more complete understanding of the present invention and further advantages thereof, reference is now made to the following detailed description, taken in conjunction with the drawings, in which.

DETAILED DESCRIPTION

The invention is set forth below in the context of an exemplary multi-layer molybdenum coating system including a CTE matching layer as well as a novel diffusion barrier layer. It will be appreciated, however, that various aspects of the invention have application beyond the exemplary embodiment described in detail below. In the following description, the coating architecture is first described. Thereafter, a process is set forth for fabricating the coating system. Finally, an analysis of actual coatings is presented to demonstrate the efficacy of the invention.

Coating Architecture

Figure 1:
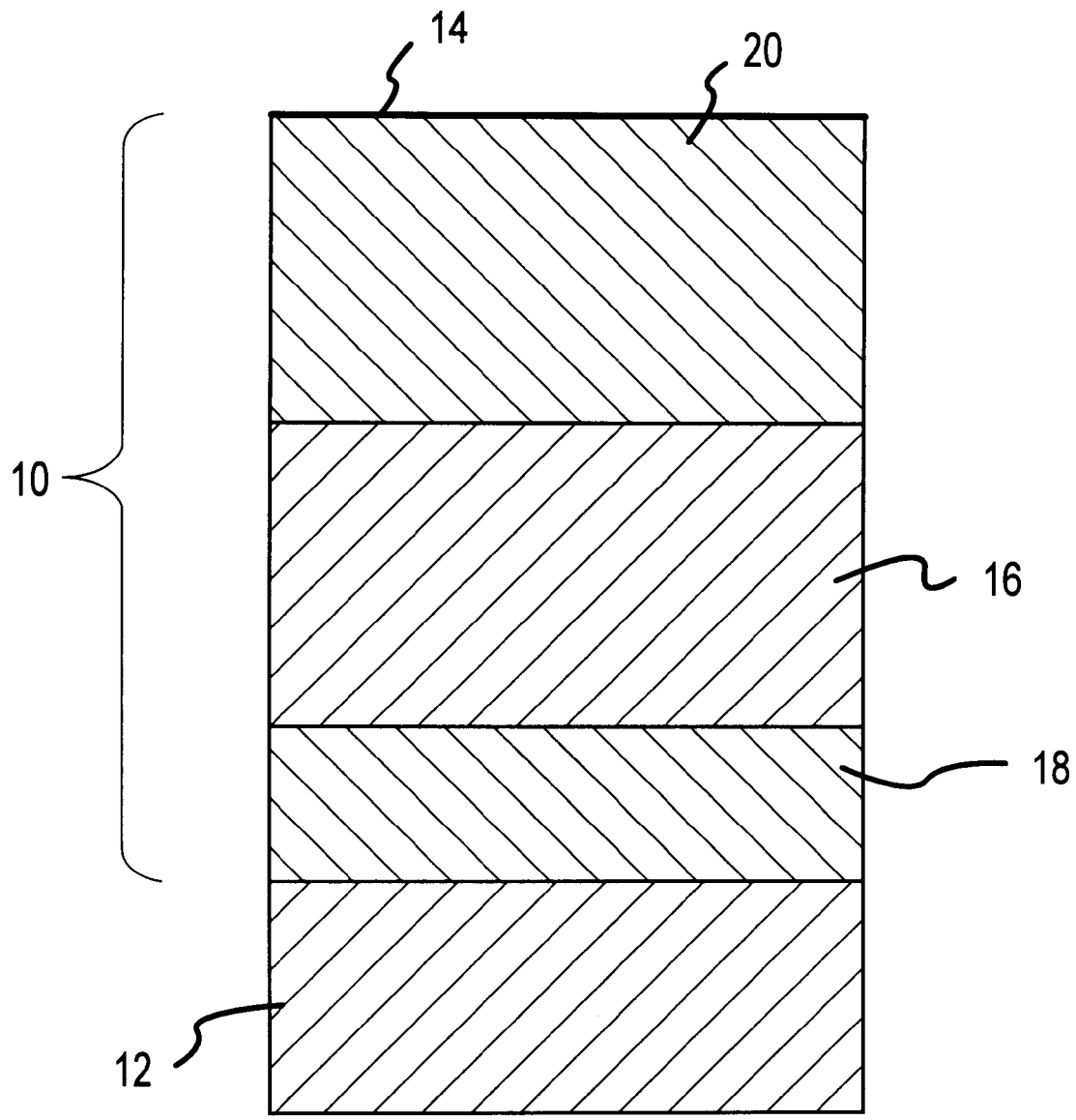
FIG. 1 is a schematic diagram, in cross-section, of a refractory metal coating system in accordance with the present invention.

FIG. 1 is a schematic diagram, in cross-section, depicting a multi-layer coating system 10 formed on a molybdenum substrate 12 in accordance with the present invention. The coating system 10 generally comprises an oxidation resistance layer 14 formed on a substrate 12, a CTE matching layer 16 disposed between the oxidation resistance layer 14 and the substrate 12, and a diffusion barrier layer 18 disposed between the CTE matching layer 16 and the substrate 12. Each of these layers is described in turn below.

The oxidation resistance layer 14 inhibits diffusion of oxygen into the substrate 12 thereby reducing oxidation which could result in degraded mechanical properties of the molybdenum product at low to intermediate temperatures, e.g., lack of ductility. In this regard, the oxidation resistance layer 14 can be formed from various materials that provide a barrier to oxygen diffusion such as certain silicon based materials. The illustrated oxidation resistance layer 14 is formed from $MoSi_2$. A glassy, self-healing silica scale 20 forms at the upper surface of the layer 14 due to initial oxidation. This scale 20 then resists oxidation diffusion through layer 14 to underlying layers of coating system 10 and the substrate 12. The oxidation resistance layer 14 can be doped, e.g., with boron and/or germanium to lower the viscosity of the silica scale 20. The layer 14 can be applied as a relatively thick coating by plasma spraying or any other suitable method.

The CTE matching layer 16 is disposed between the oxidation resistance layer 14 and the substrate 12. As discussed above, one difficulty associated with providing an oxidation resistance coating system on a molybdenum substrate is the potential CTE mismatch between typical oxidation resistance coatings and molybdenum. This mismatch can lead to interface stresses within the coating system and possible faults. In the illustrated coating system 10, the CTE mismatch between the oxidation resistance layer 14 and the substrate 12 (and barrier layer 18) is addressed by providing a CTE matching layer 16. The illustrated CTE matching layer 16 has a CTE at a first portion thereof adjacent to the interface between layers 14 and 16 that is similar to that of the oxidation resistance layer 14. In addition, the CTE matching layer 16 has a CTE at a second portion thereof adjacent to the interface between layers 16 and 18 that is similar to that of the molybdenum substrate 12.

The CTE gradient across the CTE matching layer 16 is accomplished by providing a corresponding compositional gradient across the layer 16. In particular, the illustrated layer 16 is composed of:

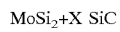

where the quantity X decreases with increasing distance from the interface between layers 16 and 18. At the interface between layers 16 and 18, X is selected to provide a CTE substantially equal to molybdenum. In this regard, the value of X at the interface between layers 16 and 18 can be approximately 1.96 (i.e., approximately 50 percent SiC by weight). The value of X, and the corresponding SiC content of the layer 16, gradually decreases with distance from the interface between layers 16 and 18 such that the layer 16 is composed of approximately 100 percent $MoSi_2$ at the interface between layers 14 and 16 (X=0). It will thus be observed that the CTE and composition of the layers 14 and 16 is nearly identical at the interface therebetween.

Barrier layer 18 is interposed between the CTE matching layer 16 and the substrate 12. The layer 18 inhibits diffusion of materials from the coating system 10 into the substrate 12. It has been found that diffusion of silicon into the substrate can result in formation of less oxidation resistant subsilicides of molybdenum and can degrade the high temperature mechanical properties of the finished coated molybdenum product. In addition, as discussed in more detail below, it has been found that carbon from the CTE matching layer 16 can diffuse into the substrate 12 degrading the mechanical properties of the substrate 12.

The illustrated barrier layer 18 inhibits diffusion of both silicon and carbon into the substrate 12. In this regard, the layer 18 is preferably formed from a material having suitable diffusion inhibiting properties. In particular, it is believed that an amorphous material is preferable for the layer 18 as an amorphous material may block interstitial diffusion pathways. Moreover, for high temperature applications, it is desirable to provide a material for layer 18 that remains amorphous after prolonged exposure to high operating temperatures. Additionally, the barrier layer 18 is preferably formed from a material having a CTE that substantially matches the CTE of the substrate 12 so as to reduce stresses at the interface between substrate 12 and barrier layer 14.

It has been found that the above considerations can be addressed by forming the barrier layer 18 from a material selected from the Mo—Si—N—C quaternary system. As previously noted, a composite film formed from $MoSi_2+1.96$ SiC has a CTE that substantially matches that of molybdenum. As is discussed in more detail below, a nitrided variation of such a film has been found to remain amorphous even after annealing at temperatures of at least 1000° C. for 30 minutes. Accordingly, the illustrated barrier layer 18 is formed from nitrided $MoSi_2+1.96$ SiC. This composition also provides certain processing conveniences as will be understood upon consideration of the description below.

Fabrication Process

Figure 2:
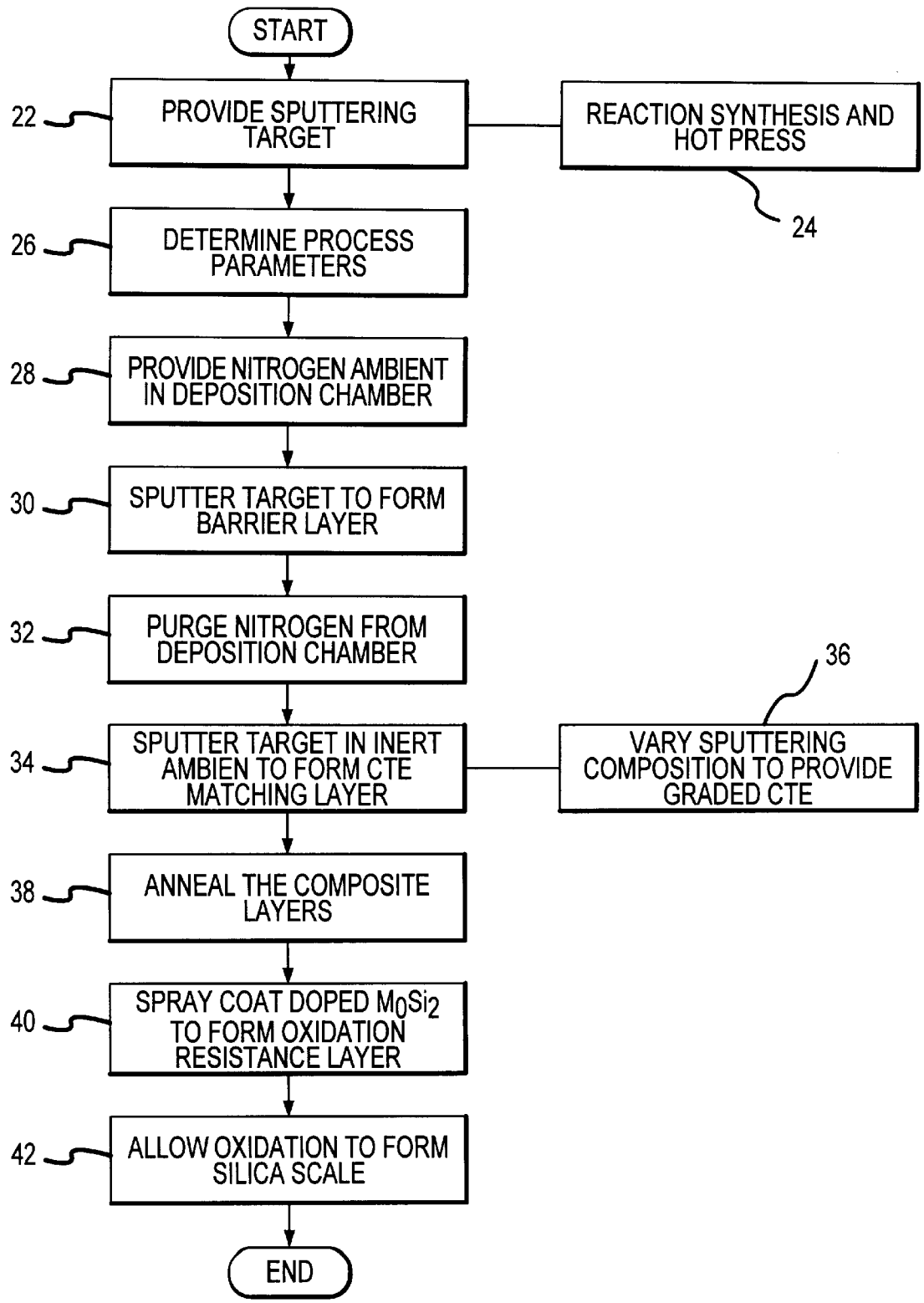
FIG. 2 is a flow diagram of a process for fabricating the coating system of FIG. 1.

A flow chart of a process for coating a molybdenum substrate in accordance with the present invention is shown on FIG. 2. In the illustrated process, the barrier layer 18 and CTE matching layer 16 are applied to the molybdenum substrate by RF sputtering. Accordingly, an appropriate sputtering target must be manufactured or otherwise provided (22). As noted above, the barrier layer 18 and CTE matching layer 16 are formed from a composite material selected such that the CTE of the composite material is similar to that of molybdenum. Although numerous barrier layer compositions are possible, it is desirable to form the barrier layer 18 from the same target components as the CTE matching layer, thereby eliminating additional processing steps. An appropriate target can be fabricated, using high purity powders of Mo, Si and Si C, through a one-step reaction synthesis followed by hot pressing (24). The reaction synthesis process is controlled to provide a target composition of approximately $MoSi_2+1.96$ mole fraction Si C, so that the nitrided composite film has a CTE that closely matches the CTE of molybdenum. This composition may be modified somewhat to account for CTE variation as between the substrate 12 and the nitrided barrier layer 18. In one embodiment, the sputtering target had dimensions of 2.3 inches in diameter by 0.23 inches thick.

The next steps relate to depositing a film from the target onto the substrate 12 to form the barrier layer 18. This is accomplished by determining (26) appropriate process parameters for deposition, providing (28) a nitrogen ambient for deposition of the barrier layer 18 and sputtering (30) the target in the nitrogen ambient to deposit a Mo $Si_x C_y N_z$ film, where the specific composition is determined by the deposition process parameters including the partial pressure of nitrogen in the chamber during deposition. This film can be deposited, for example, by RF sputtering in a horizontal cathode sputtering machine such as Vac Tec Model ML1AV, or other deposition equipment that preferably allows for reactive sputtering, multiple process gas control, and multiple target deposition for varying film composition. In one implementation, the above-noted Vac Tec machine can be used to form the barrier layer 18 by sputtering the composite target. In this regard, appropriate modifications can be made to the magnetic module of the deposition machine, and an appropriate array of cascading dark shields can be provided in order to accommodate the composite target. During deposition of the barrier layer 18, a mixed argon/nitrogen ambient was employed to form a nitrided film through reactive sputtering. The deposition process parameters included: a base pressure of between about 8 to $12\times10^{-4}$ Pa; an argon pressure during sputtering of between about 0.27 to 1.2 Pa; a nitrogen partial pressure of about 0.10; a target to substrate distance of about 70 mm; and an RF power, provided by a Henry Radio power supply, of between about 125 to 500 W.

Deposition under these conditions is conducted until a layer of sufficient thickness is formed on the substrate 12. In this regard, a series of experiments indicated that, of the process parameters identified above, a principle parameter affecting deposition rate was power. In particular, the deposition rate was determined to be about:

$$D=13.74+0.055\ P$$

where D is given in nm/min and P is in Watts. The desired coating system performance was achieved, for example, with a barrier layer thickness of about 50 nm, corresponding to a deposition time range of about 1.2 mins (at 500 W) to 2.4 mins (at 125 W).

After the nitrided barrier layer 18 has been formed, the CTE matching layer 16 is deposited. In the illustrated implementation of the present invention, the CTE matching layer 16 can be conveniently deposited from the same target used for deposition of the barrier layer 18. However, the CTE matching layer 16 is preferably formed without reactive sputtering such that the initial composition of the CTE matching layer substantially matches that of the composite target. Accordingly, once a sufficient thickness of the barrier layer has been applied, the deposition chamber is purged (32) of nitrogen, e.g., by vacuum pumps in combination with valves for controlling the pressures of argon and nitrogen, and sputtering (34) continues in an inert argon ambient. Other than these adjustments relating to the argon and nitrogen pressures, deposition can continue with process parameters generally in the ranges noted above.

In order to provide the desired CTE gradient across the CTE matching layer 16 in the illustrated implementation of the invention, a corresponding compositional gradient is provided by varying (36) the SiC component of the matching layer 16. In particular, the proportion of SiC is gradually decreased and the proportion of $MoSi_2$ is gradually increased during deposition of the layer 16. This can be accomplished by any suitable process, such as by providing at least one separate $MoSi_2$ target and controlling the relative deposition rates from SiC target and the $MoSi_2$ target(s) to achieve the compositional and CTE gradient. The desired coating system performance can be achieved, for example, with an overall CTE matching layer thickness of about 450 nm corresponding to a deposition time of about 20–30 mins. depending in part on the power supplied at the various cathodes.

After the barrier layer 18 and CTE matching layer 16 (collectively, the "composite layers") are formed, the coated substrate is annealed (38) in a vacuum furnace, e.g., for about 30 mins. at a temperature of about 1000° C. As shown below, the composite layers are amorphous as deposited. The CTE matching layer 16 crystallizes upon annealing but the barrier layer 18 remains amorphous.

It is believed that the barrier layer 18 of the present invention will remain amorphous at operating temperatures well in excess of 1000° C. This amorphous structure is believed to contribute to inhibiting diffusion of C and Si into the molybdenum substrate 12 by blocking interstitial diffusion pathways. As a result, the coating system of the present invention is particularly well-suited for high temperature applications such as coating electrodes used to heat molten glass baths in glass manufacturing and coating turbine blades used in jet engines.

After annealing the composite layers, the oxidation resistance layer 14 is applied. The layer 14 can be conveniently applied as a thick coating by plasma spraying (40) or other method. Any of various suitable oxidation resistant materials can be used to form the layer 14. In the illustrated implementation, the layer 14 is formed primarily from $MoSi_2$. This coating layer, after being allowed (42) to oxidize, e.g., upon exposure to air, forms a glassy, silica scale on its upper surface which functions as a barrier to oxygen diffusion thereby providing the desired oxidation resistance. The coating layer 14 is preferably doped with boron or germanium which helps to lower the viscosity of the glassy scale. As discussed below, the resulting coating system, in addition to addressing the potential CTE mismatch between the oxidation resistance layer 14 and the substrate 12, is effective in preventing oxidation of the substrate, and does not result in substantial diffusion of C, Si or other coating materials into the substrate.

Coating Analysis

Figure 3:
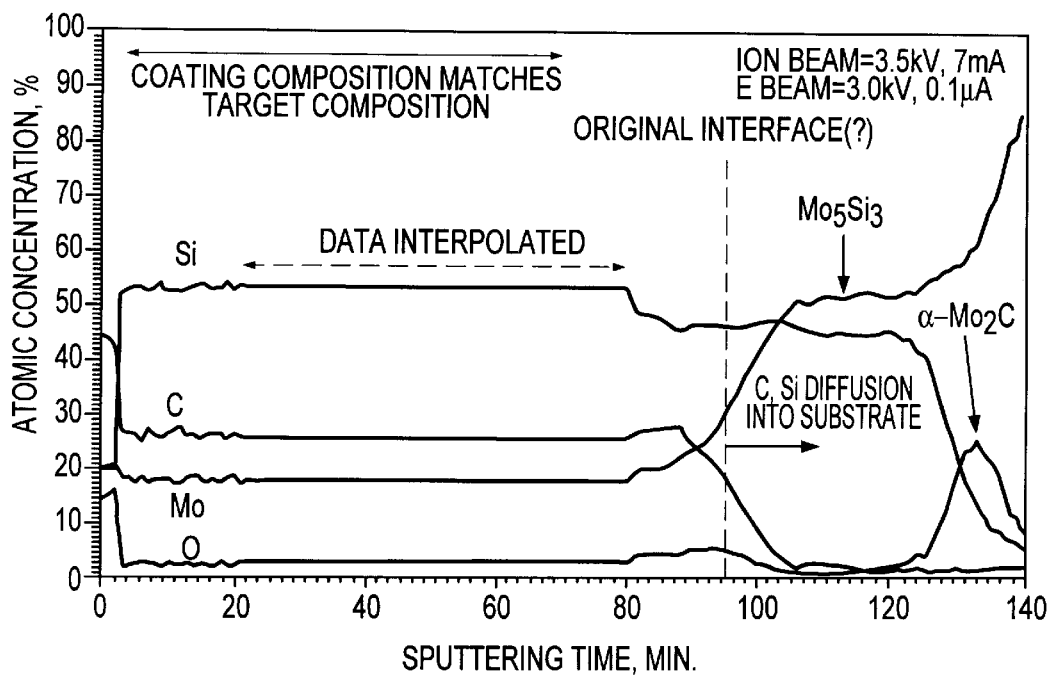
FIG. 3 is an auger electron spectroscopy depth profile showing certain diffusion phenomena in the absence of a suitable diffusion barrier.

FIGS. 3–6 illustrate certain advantages of the present invention and demonstrate the effectiveness of actual coatings manufactured in accordance with the present invention. FIG. 3 shows a depth profile obtained by auger electron spectroscopy of a molybdenum substrate coated by RF sputtering using a composite target, as described above, but without a nitrided barrier layer. The coating was applied to a thickness of about 450 nm corresponding to a sputtering time of about 90–95 minutes under the processing parameters employed. As shown, the coating composition is substantially uniform over about the top 400 nm of the coating. The depth profile also shows the depletion of carbon and formation of $Mo_5Si_3$ at the coating substrate interface, as well as the reappearance of C within the substrate suggesting the possible location of $Mo_2C$ and $Mo_3Si$. Thus, FIG. 3 demonstrates the occurrence of diffusion of Si and C into the substrate in the absence of an effective barrier layer. Such diffusion would be expected to degrade the high temperature mechanical properties of a coated molybdenum product.

Figure 4:
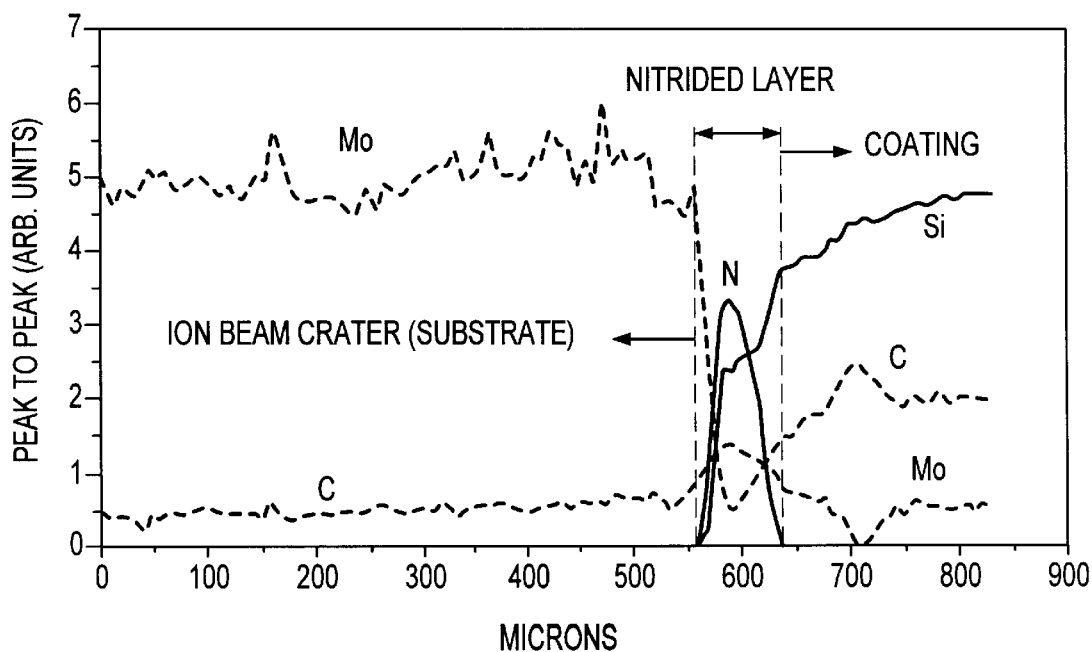
FIG. 4 shows auger line scans across the edge of an ion beam sputtered crater, confirming the efficacy of the diffusion barrier layer of the present invention.

FIG. 4 shows auger line scans across the edge of an ion beam sputtered crater for a molybdenum substrate coating system including a barrier layer and a CTE matching layer (only partially shown) as described above. As shown, very little C or Si diffuses across the nitrided barrier layer from the coating (CTE matching layer) into the substrate, thereby confirming the efficacy of the nitrided barrier layer.

Figure 5A:
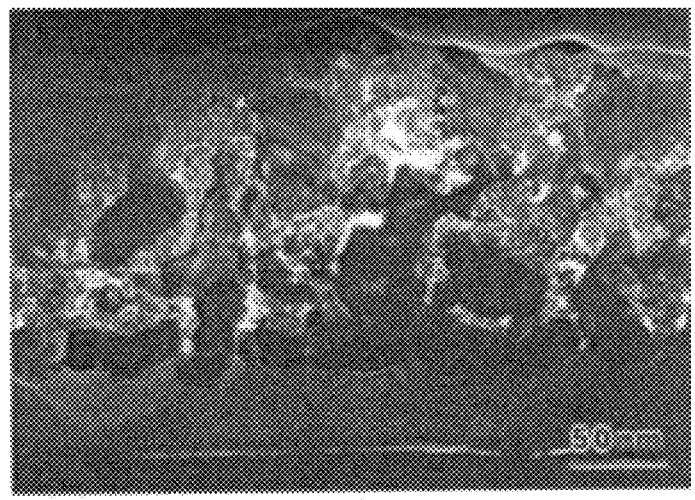
FIG. 5a is a scanning transmission electron microscopy photomicrograph of a coating system according to the present invention.

FIG. 5a shows a scanning transmission electron microscopy photomicrograph of a film substrate cross-section, in accordance with the present invention as described above, after annealing at 1000° C. for 30 minutes. The photomicrograph shows that the barrier layer remained amorphous after annealing suggesting that the barrier layer will be effective for high temperature applications.

Figure 5B:
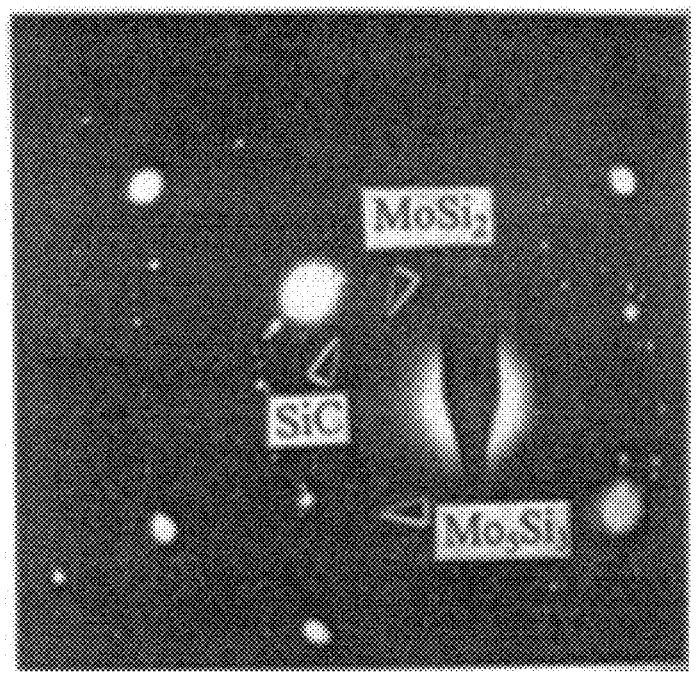
FIG. 5b is a selected area diffraction pattern of a portion of a composite film of a CTE matching layer according to the present invention.

FIG. 5b shows a selected area diffraction pattern of a portion of the composite film of a CTE matching layer according to the present invention. The diffraction pattern shows that the CTE matching layer, unlike the nitrided barrier layer, crystallizes upon annealing, including crystallites of $t-MoSi_2$, $\beta-SiC$, and $t-Mo_5Si_3$. It is thus apparent that the barrier layer, selected from the Mo—Si—C—N quaternary system, provides enhanced high-temperature characteristics.

Figure 6:
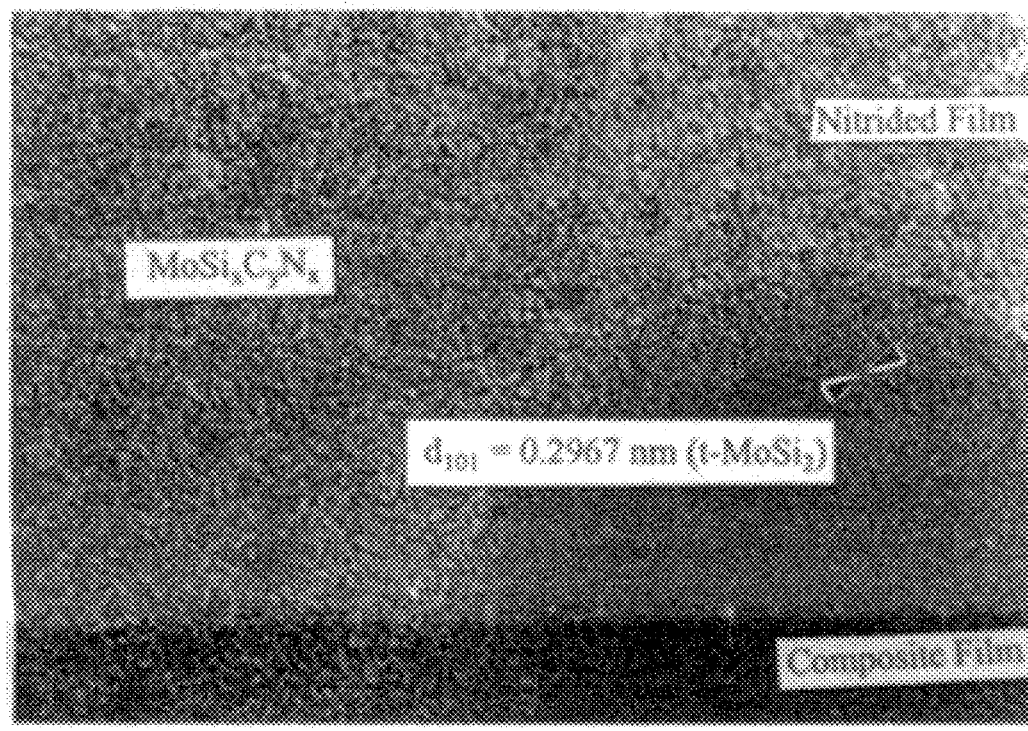
FIG. 6 is a high magnification image of an amorphous barrier layer/crystalline CTE matching layer interface according to the present invention.

FIG. 6 shows a high magnification image of the barrier layer/CTE matching layer interface after annealing. Lattice fringes indicative of crystallization are only observed in the CTE matching layer ("composite film"), not in the barrier layer ("nitrided film"), thus demonstrating that the barrier layer has remained amorphous after annealing. The barrier layer of the present invention is thus believed to inhibit or substantially prevent diffusion of silicon and carbon up to temperatures of at least 1000° C., and to remain stable in an oxidizing environment at temperatures up to at least 1390° C.

While various implementations of the present invention have been described in detail, it is apparent that further modifications and adaptations of the invention will occur to those skilled in the art. However, it is to be expressly understood that such modifications and adaptations are within the spirit and scope of the present invention.

What is claimed is:

1. A refractory metal product for use in glass manufacturing, comprising:
   a substrate including a refractory metal, said substrate forming part of an electrode assembly for heating molten glass in a glass manufacturing facility;
   a first layer, disposed on said substrate, including carbon; and
   a barrier layer, disposed between said first layer and said substrate, for inhibiting diffusion of carbon from said first layer to said substrate, said barrier layer comprising an amorphous material that is structurally stable at temperatures of at least about 1000° C.

2. A refractory metal product as set forth in claim 1, wherein said substrate is formed from molybdenum.

3. A refractory metal product as set forth in claim 1, wherein said first layer further comprises silicon and said barrier layer inhibits diffusion of said silicon from said first layer to said substrate.

4. A refractory metal product as set forth in claim 1, wherein said first layer has a first composition at a first portion thereof and a second composition, different from said first composition, at a second portion thereof, said first portion being located closer than said second portion to said barrier layer.

5. A refractory metal product as set forth in claim 4, wherein said first layer has a greater proportion of carbon in said first portion than in said second portion.

6. A refractory metal product as set forth in claim 1, wherein said first layer has a coefficient of thermal expansion (CTE), at a first portion thereof adjacent to said barrier layer, that substantially matches the CTE of at least one of the substrate and the barrier layer.

7. A refractory metal product as set forth in claim 1, wherein a CTE of said first layer varies with respect to a dimension of said first layer.

8. A refractory metal product as set forth in claim 1, wherein said first layer is comprised of molybdenum, silicon and carbon.

9. A refractory metal product as set forth in claim 1, wherein said first layer is formed by sputtering a target of $MoSi_2+X$ SiC where X is a mole fraction selected such that the CTE of the target substantially matches at least one of the substrate and the barrier layer.

10. A refractory metal product as set forth in claim 1, wherein said barrier layer is amorphous.

11. A refractory metal product as set forth in claim 1, wherein said barrier layer is formed from material from the Mo—Si—C—N quaternary system.

12. A refractory metal product as set forth in claim 1, wherein said barrier layer is formed by sputtering a target in a nitrogen ambient.

13. A refractory metal product as set forth in claim 1, further comprising an oxidation resistance layer disposed on said substrate, wherein said first layer is disposed between said oxidation resistance layer and said substrate.

14. A refractory metal product as set forth in claim 13, wherein said first layer has a first CTE at a first portion thereof adjacent to said substrate and a second CTE at a second portion thereof adjacent to said second layer, said first CTE being closer than said second CTE to a CTE of said substrate and said second CTE being closer than said first CTE to a CTE of said second layer.

15. A refractory metal product as set forth in claim 13, herein said oxidation resistance layer comprises $MoSi_2$.

16. A refractory metal product comprising:
    a substrate that includes a refractory metal, said substrate forming part of an electrode assembly for heating molten glass in a glass manufacturing facility;
    an oxidation resistance layer disposed on said substrate; and
    a diffusion barrier layer, disposed between said oxidation resistance layer and said substrate, wherein said diffusion barrier layer comprises an amorphous material including a carbon component.

17. A metal refractory product as set forth in claim 16, wherein said diffusion barrier layer further includes said refractory metal, silicon and nitrogen.

18. A metal refractory product as set forth in claim 16, wherein said material is formed by sputtering a target in a nitrogen ambient.

19. A metal refractory product as set forth in claim 18, wherein said target is formed from a silicide of a refractory metal and a silicide of carbon.

20. A refractory metal product for use in glass manufacturing, comprising:
    a substrate including a refractory metal, said substrate forming part of an electrode assembly for heating molten glass in a glass manufacturing facility;
    an oxidation resistance layer disposed on such substrate;
    a CTE gradient layer disposed between said substrate and said oxidation resistance layer, said CTE gradient layer having a CTE that varies with respect to a dimension of such CTE gradient layer; and
    a barrier layer disposed between said CTE gradient layer and said substrate for inhibiting diffusion of material across said barrier layer into such substrate.

21. A refractory metal product as set forth in claim 20, wherein said refractory metal comprises molybdenum.

22. A refractory metal product as set forth in Claim 20, wherein said oxidation resistance layer comprises $MoSi_2$.

23. A refractory metal product as set forth in claim 20, wherein said CTE gradient layer includes a first portion adjacent to said oxidation resistance layer having a CTE that substantially matches the CTE of said oxidation resistance layer, and a second portion adjacent to said barrier layer having a CTE that substantially matches a CTE of at least one of said barrier layer and said substrate.

24. A refractory metal product as set forth in claim 20, wherein said barrier layer includes carbon.

25. A refractory metal product as set forth in claim 20, wherein said barrier layer is formed from a material in the Mo—Si—C—N quaternary system.

26. A refractory metal product as set forth in claim 16, wherein said substrate is formed from molybdenum.

27. A refractory metal product as set forth in claim 16, wherein said oxidation resistance layer comprises $MoSi_2$.

28. A refractory metal product as set forth in claim 16, wherein said diffusion barrier layer is formed from material from the Mo—Si—C—N quaternary system.

29. A refractory metal product as set forth in claim 16, wherein said amorphous material is structurally stable at temperatures up to at least about 1000° C.

30. A metal refractory product as set forth in claim 16, further comprising a first layer disposed between said substrate and said oxidation resistance layer.

31. A refractory metal product as set forth in claim 30, wherein said first layer further comprises silicon and said diffusion barrier layer inhibits diffusion of said silicon from said first layer to said substrate.

32. A refractory metal product as set forth in claim 30, wherein said first layer comprises silicon and carbon.

33. A refractory metal product as set forth in claim 30, wherein said first layer is comprised of molybdenum, silicon and carbon.

34. A refractory metal product as set forth in claim 30, wherein said first layer comprises $MoSi_2$.

35. A refractory metal product as set forth in claim 30, wherein a coefficient of thermal expansion (CTE) of said first layer varies with respect to a dimension of said first layer.

36. A refractory metal product as set forth in claim 30, wherein said first layer has a first composition at a first portion thereof and a second composition, different from said first composition, at a second portion thereof, said first portion being located closer than said second portion to said diffusion barrier layer.

37. A refractory metal product as set forth in claim 36, wherein said first layer has a greater proportion of carbon in said first portion than in said second portion.

38. A refractory metal product as set forth in claim 30, wherein said first layer has a coefficient of thermal expansion (CTE), at a first portion thereof adjacent to said diffusion barrier layer, that substantially matches the CTE of at least one of the substrate and the diffusion barrier layer.

39. A refractory metal product as set forth in claim 30, wherein said first layer has a first CTE at a first portion thereof adjacent to said substrate and a second CTE at a second portion thereof adjacent to said oxidation resistance layer, said first CTE being closer than said second CTE to a CTE of said substrate and said second CTE being closer than said first CTE to a CTE of said oxidation resistance layer.

40. A refractory metal product as set forth in claim 30, wherein said first layer includes a first portion adjacent to said oxidation resistance layer having a CTE that substantially matches the CTE of said oxidation resistance layer, and a second portion adjacent to said diffusion barrier layer having a CTE that substantially matches a CTE of at least one of said diffusion barrier layer and said substrate.

41. A refractory metal product as set forth in claim 30, wherein said first layer comprises a CTE matching layer for reducing stresses due to a CTE mismatch between said substrate and said oxidation resistance layer.

42. A refractory metal product as set forth in claim 30, wherein said first layer is formed by sputtering a target of $MoSi_2$+X SiC where X is a mole fraction selected such that the CTE of the target substantially matches at least one of the substrate and the diffusion barrier layer.

* * * * *